(12) United States Patent
Ding et al.

(10) Patent No.: US 8,311,083 B2
(45) Date of Patent: Nov. 13, 2012

(54) JOINT TRANSMIT AND RECEIVE I/Q IMBALANCE COMPENSATION

(75) Inventors: Lei Ding, Dallas, TX (US); Zigang Yang, Plano, TX (US); Fernando Mujica, Allen, TX (US); Roland Sperlich, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 522 days.

(21) Appl. No.: 12/648,898

(22) Filed: Dec. 29, 2009

(65) Prior Publication Data

US 2011/0158297 A1 Jun. 30, 2011

(51) Int. Cl.
*H04L 5/16* (2006.01)

(52) U.S. Cl. ........ 375/219; 375/260; 375/296; 375/340; 455/63.1; 455/67.13; 455/114.2; 455/126

(58) Field of Classification Search .................. 375/219, 375/221, 222, 260, 261, 284, 285, 295–297, 375/316, 340, 347; 455/501, 63.1, 67.11, 455/37.13, 114.2–114.3, 115.1, 126, 296, 455/302, 303, 305; 332/123, 124, 159, 160; 329/302, 306, 308, 318–320, 349–351; 370/276, 370/278, 282, 286
See application file for complete search history.

(56) References Cited

U.S. PATENT DOCUMENTS

| | | | |
|---|---|---|---|
| 7,333,423 B2 * | 2/2008 | Palaskas et al. | ............... 370/210 |
| 7,463,866 B1 | 12/2008 | Chen | |
| 7,502,603 B2 * | 3/2009 | Mohindra | ................. 455/278.1 |
| 7,567,611 B2 | 7/2009 | Chien | |
| 7,567,783 B1 | 7/2009 | Chen | |
| 7,570,923 B2 * | 8/2009 | Kiss et al. | .................. 455/67.14 |
| 7,944,984 B1 * | 5/2011 | Wu et al. | ........................ 375/261 |
| 2006/0109893 A1 * | 5/2006 | Chen et al. | ..................... 375/219 |

OTHER PUBLICATIONS

"Classical and Modern Receiver Architectures," IEEE Commun. Mag., vol. 38, No. 11, 2000, pp. 132-139 (Shahriar Mirabbasi and Ken Martin).
"Adaptive Compensation for Imbalance and Offset Losses in Direct Conversion Transceivers," IEEE Trans. Veh. Technol., vol. 42, No. 4, pp. 581-588, Nov. 1993 (James K. Cavers and Maria W. Liao).
"Automatic Adjustment of Quadrature Modulators," Electron. Lett., vol. 27, No. 3, pp. 214-216 (M. Faulkner, T Mattison and W. Yates).
"Compensation of Frequency-Dependent Gain/Phase Imbalance in Predistortion Linearization Systems," IEEE Trans. Circuits Syst., vol. 55, No. 1, 2008, pp. 390-397 (Lei Ding, Zhengxiang Ma, Dennis R. Morgan, Mike Zierdt, and G. Tong Zhou).
"Frequency-Selective I/Q Mismatch Calibration of Wideband Direct-Conversion Transmitters," IEEE Trans. Circuits, Syst. vol. 55, No. 4, Apr. 2008, pp. 359-363 (Lauri Anttila, Mikko Valkama and Markku Renfors). "Circularity-Based I/Q Imbalance Compensation in Wideband Direct-Conversion Receivers," IEEE Trans. Veh. Technol., vol. 57, No. 4, Jul. 2008, pp. 2099-2113 (Lauri Anttila, Mikko Valkama, and Markku Renfors).

* cited by examiner

*Primary Examiner* — Dac Ha
(74) *Attorney, Agent, or Firm* — John J. Patti; Wade J. Brady, III; Frederick J. Telecky, Jr.

(57) ABSTRACT

Conventional transceivers do provide some compensation for in-phase/quadrature (I/Q) imbalance. However, these techniques do not separately compensate for I/Q imbalance for the transmitter and receiver sides of the transceiver. Here, a transceiver is provided that allows for compensation of I/Q imbalance in the transmitter and receiver irrespective of the other to allow for a more accurate transceiver.

13 Claims, 3 Drawing Sheets

JOINT TRANSMIT AND RECEIVE I/Q IMBALANCE COMPENSATION

TECHNICAL FIELD

The invention relates generally to a radio frequency (RF) transceiver and, more particularly, to in-phase/quadrature (I/Q) mismatch compensation for an RF transceiver.

BACKGROUND

The direct conversion radio architecture is a popular choice for radio frequency (RF) transceiver design. It uses fewer components and is easier to integrate compared to the conventional heterodyne architecture. See, e.g., Mirabbasi et al., "Classical and modern receiver architectures," *IEEE Commun. Mag.*, vol. 38, no. 11, pp. 132-139, 2000. Those benefits also come with several well-known impairments, namely in-phase/quadrature (I/Q) imbalance and direct current (DC) offset.

In a direct conversion transceiver, a quadrature modulator (QM) implements I/Q modulation and RF upconversion, while a quadrature demodulator (QDM) realizes I/Q demodulation and RF downconversion. Because of the limitation in analog circuit precision, the quadrature carriers used in QM and QDM do not have exactly the same amplitude and a perfect 90° phase difference. Similarly, the analog reconstruction filters on the I and Q paths may not match exactly. These imperfections are called I/Q imbalance, which causes cross talk between I and Q channels and which creates undesired images of the original signal. Addition, because of limited isolation in analog components, some of the local oscillator (LO) power can leak into RF output, which creates LO spikes in transmitted signal and DC offset in received signal.

Most existing compensation techniques treat transmit and receive I/Q imbalance separately. To compensate for I/Q imbalance in the transmitter, the receive side is either assumed to have dedicated feedback loops or digital demodulators with perfect quadrature carriers. See, e.g., Cavers et al., "Adaptive compensation for imbalance and offset losses in direct conversion transceivers," *IEEE Trans. Veh. Technol.*, vol. 42, no. 4, pp. 581-588, 1993; Faulkner et al., "Automatic adjustment of quadrature modulators," *Electron. Lett.*, vol. 27, no. 3, pp. 214-216, 1991; Ding et al., "Compensation of Frequency-Dependent Gain/Phase imbalance in predistortion linearization systems," *IEEE Trans. Circuits Syst.*, vol. 55, no. 1, pp. 390-397, 2008; and Anttila et al., "Frequency-Selective I/Q mismatch calibration of wideband Direct-Conversion transmitters," *IEEE Trans. Circuits Syst.*, vol. 55, no. 4, pp. 359-363, 2008. To compensate for I/Q imbalance in the receiver, the transmit side is usually assumed to be free of I/Q imbalance. See, e.g., Anttila et al., "Circularity-Based I/Q imbalance compensation in wideband Direct-Conversion receivers," *IEEE Trans. Veh. Technol.*, vol. 57, no. 4, pp. 2099-2113, 2008. Each of these different approaches, however, has undesirable effects and drawbacks.

Some other conventional techniques are as follows: U.S. Pat. Nos. 7,463,866; 7,567,611; and 7,567,783.

SUMMARY

A preferred embodiment of the present invention, accordingly, provides an apparatus. The apparatus comprises a transmit path that is coupled to radio frequency (RF) circuitry, wherein the transmit path includes a modulation compensator that compensates for in-phase/quadrature (I/Q) mismatch in the transmit path; a switch that is coupled to the RF circuitry; a delay element that is coupled to the RF circuitry and that is coupled to the switch so as to actuate and deactuate the switch; and a receive path that is coupled to switch, wherein the receive path includes a demodulation compensator that compensates for I/Q mismatch in the receive path.

In accordance with a preferred embodiment of the present invention, each of the receive and transmit paths further comprise an in-phase path and a quadrature path.

In accordance with a preferred embodiment of the present invention, the in-phase path for the transmit path further comprises: an in-phase filter that is coupled to the modulation compensator; an in-phase digital-to-analog converter (DAC) that is coupled to the in-phase filter; an in-phase low pass filter (LPF) that is coupled to the in-phase DAC; and an in-phase mixer coupled to the in-phase LPF.

In accordance with a preferred embodiment of the present invention, the quadrature path for the transmit path further comprises: a quadrature filter that is coupled to the modulation compensator; a quadrature DAC that is coupled to the quadrature filter; a quadrature LPF that is coupled to the quadrature DAC; and a quadrature mixer coupled to the quadrature LPF.

In accordance with a preferred embodiment of the present invention, the transmit path further comprises: an adder that is coupled to the in-phase mixer and the quadrature mixer; a local oscillator that is coupled to the in-phase mixer; and a phase delay circuit that is coupled to the local oscillator and the quadrature mixer.

In accordance with a preferred embodiment of the present invention, the in-phase path for the receive path further comprises: an in-phase mixer that is coupled to the switch; an in-phase LPF that is coupled to the in-phase mixer; and an in-phase analog-to-digital converter (ADC) that is coupled to the in-phase LPF and the demodulation compensator.

In accordance with a preferred embodiment of the present invention, the quadrature path for the receive path further comprises: a first quadrature mixer that is coupled to the switch; a quadrature LPF that is coupled to the first quadrature mixer; a quadrature ADC that is coupled to the quadrature LPF; and a second quadrature mixer that is coupled to the quadrature ADC and the demodulation compensator.

In accordance with a preferred embodiment of the present invention, the transmit path further comprises: a local oscillator that is coupled to the in-phase mixer; and a phase delay circuit that is coupled to the local oscillator and the first quadrature mixer.

In accordance with a preferred embodiment of the present invention, the relationship between an input signal (u(n)) and an output signal (x(n)) for the modulation compensator is:

$$x(n) = u(n) - \frac{h_m}{h_d} u^*(n) - \frac{c}{h_d},$$

wherein c, $h_m$, and $h_d$ are parameters for the apparatus.

In accordance with a preferred embodiment of the present invention, the relationship between an input signal (y(n)) and an output signal (v(n)) for the demodulation compensator is:

$$v(n) = [y(n) - d] - \frac{g_m}{g_d^*} [y^*(n) - d],$$

wherein d, $g_m$, and $h_d$ are parameters for the apparatus.

In accordance with a preferred embodiment of the present invention, an apparatus is provided. The apparatus comprises a transmit path having: a modulation compensator that compensates for I/Q mismatch in the transmit path; an in-phase filter that is coupled to the modulation compensator; a quadrature filter that is coupled to the modulation compensator; a first DAC that is coupled to the in-phase filter; a second DAC that is coupled to the quadrature filter; a first LPF that is coupled to the first DAC; a second LPF that is coupled to the second DAC; a first local oscillator; a first mixer that is coupled to the first local oscillator and the first LPF; a first phase delay circuit that is coupled to the first local oscillator; a second mixer that is coupled to first phase delay circuit and the second LPF; and an adder that is coupled to the first and second mixers; RF circuitry that is coupled to the adder; a switch that is coupled to the RF circuitry; a delay element that is coupled to the RF circuitry and that is coupled to the switch so as to actuate and deactuate the switch; and a receive path having: a third mixer that is coupled to the switch; a fourth mixer that is coupled to the switch; a second local oscillator that is coupled to the third mixer; a second phase delay circuit that is coupled to the second local oscillator and the fourth mixer; a third LPF that is coupled to the third mixer; a fourth LPF that is coupled to the fourth mixer; a first analog-to-digital converter (ADC) that is coupled to the third LPF; a second ADC that is coupled to the fourth LPF; a fifth mixer that is coupled to the second ADC; and a demodulation compensator is coupled to the first ADC and the fifth mixer, wherein the demodulation compensator compensates for I/Q mismatch in the receive path.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
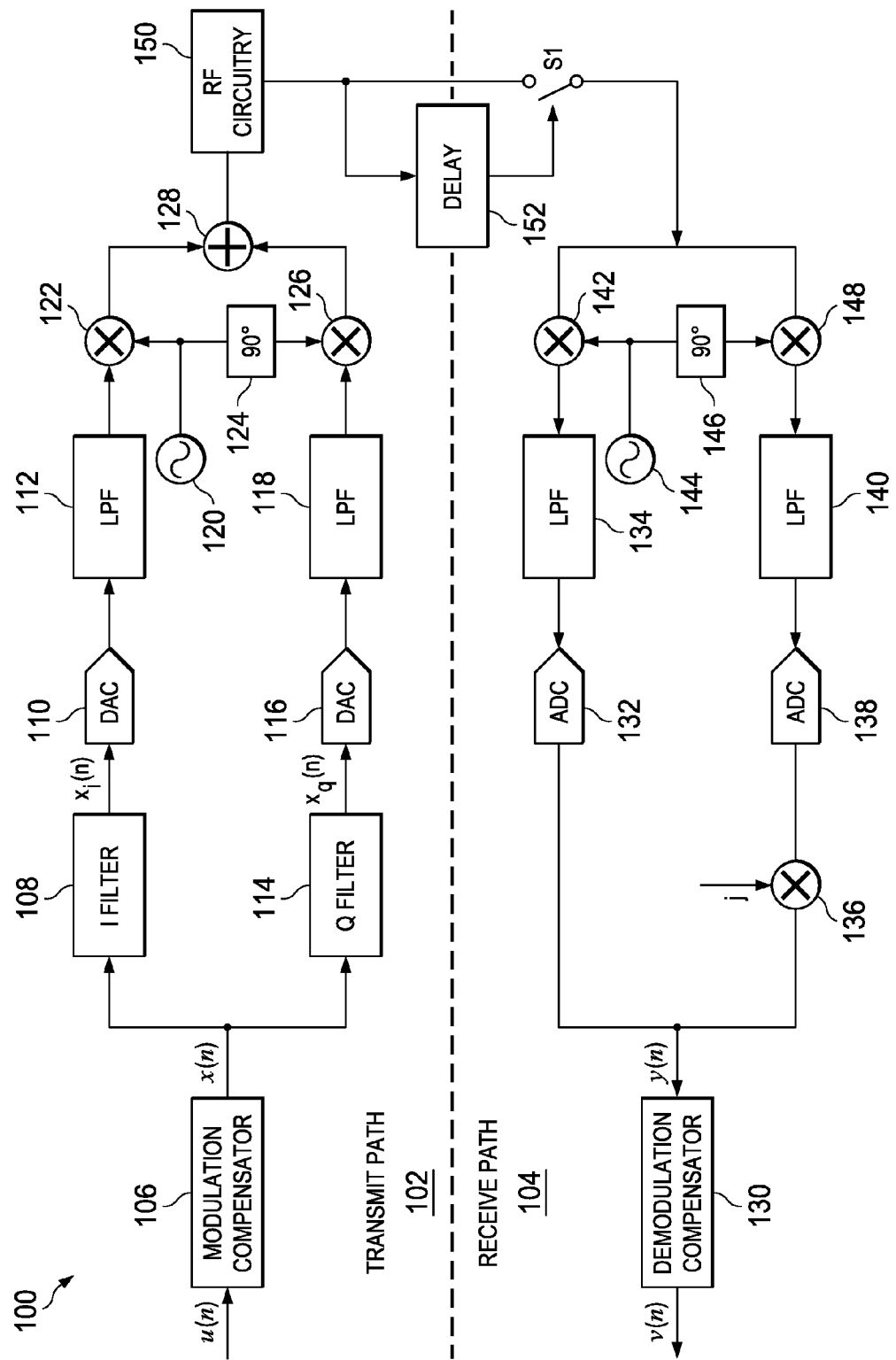
FIG. 1 is a radio frequency (RF) transceiver in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates a radio frequency (RF) transceiver in accordance with a preferred embodiment of the present invention. Transceiver 100 generally comprises a transmit path 102, RF circuitry 150, a receive path 104, a delay element 152, and switch 51. The transmit path 102 also generally comprises modulation compensator 106, in-phase (I) filter 108, quadrature (Q) filter 114, digital-to-analog converters (DACs) 110 and 116, low pass filters (LPFs) 112 and 118, mixers 122 and 126, local oscillator (LO) 120, 90° phase delay circuit 124, and adder 128. The receive path 104 generally comprises a demodulation compensator 130, analog-to-digital converters (ADCs) 132 and 138, LPFs 134 and 140, LO 144, mixers 136, 142, and 148, and 90° phase delay circuit 146.

Look first to the transmit path 102, in operation, the transmit path 102 receives a baseband signal u(n) and outputs an RF signal through the RF circuitry 150. Initially, the modulation compensator 106 generates a compensated signal x(n) from the baseband signal u(n). I filter 108 and Q filter 114 generate the I or real portion $x_i(n)$ and Q or imaginary portion $x_q(n)$ of the compensated signal x(n), respectively. DACs 110 and 116 convert the I portion $x_i(n)$ and Q portion $x_q(n)$ of the compensated signal x(n), respectively, to digital signals, which are then filtered by LPFs 122 and 126, converted to an RF signal by mixers 122 and 125, phase delay circuit 124, and adder 128, and transmitted through RF circuitry 150.

Now turning to the receive path 104, in operation, the receive path 104 receives a signal through the RF circuitry 150 to generate a baseband signal v(n). Simply put, ADCs 132 and 138, LPFs 134 and 140, LO 144, mixers 136, 142, and 148, and phase delay circuit 146 demodulate the RF signal from the RF circuitry 150 to generate a demodulated signal y(n). This demodulated signal y(n) is adjusted by the demodulation compensator 130 to generate a compensated baseband signal v(n).

Of interest, however, is the operation of the modulation compensator 106 and demodulation circuit 130. Each of these circuits 130 and 106 is able to compensate for I/Q imbalance within its respect path irrespective of the other path. These circuits 130 and 106 are able to accomplish this as a result of the delay element 152 (which can be linear or non-linear) and switch 51 (which is actuated and deactuated by the delay element 152. As a result, greatly improved performance can be observed. Additionally, delay element 152 may be comprised of a phase rotation circuit so as to introduce different phase rotations for each path 102 and 104.

For a given baseband signal $z_t(n)$, signal x(n) can be represented as follows:

$$z_t(n) = h_d x(n) + h_m x^*(n) + c \quad (1)$$

where $h_d$, $h_m$, and c are numeral constants. Additionally, because the switch Si can represent two different paths with different delays or the same paths with variable delay settings, phase rotations can be introduced to the baseband signal $z_t(n)$ for two paths or channels A and B becoming:

$$z_r(n) = A z_t(n) \quad (2)$$

$$z_r(n) = B z_t(n) \quad (3)$$

Preferably, the phase rotations between the two paths can have at least a 10% difference. For example, the phase difference can be between 36° and 324°. Similar to equation (1), signal y(n) also can be represented as follows:

$$y(n) = g_d z_r(n) + g_m z_r^*(n) + d \quad (4)$$

where $g_d$, $g_m$, and d are numerical constants; numerical constant d is specifically related to the length of the delay of delay element 152. Now substituting equations (1), (2), and (3) into equation (4), it becomes:

$$y(n) = Ah_d g_d x(n) + (Ah_m g_d + A^* h_d^* g_m)x^*(n) + Ag_d c + A^* g_m c^* + d \quad (5)$$
$$= A_d x(n) + A_m x^*(n) + A_o$$

$$y(n) = Bh_d g_d x(n) + (Bh_m g_d + B^* h_d^* g_m)x^*(n) + Bg_d c + B^* g_m c^* + d \quad (6)$$
$$= B_d x(n) + B_m x^*(n) + B_o$$

Writing each of equations (5) and (6), each (respectively) becomes:

$$\vec{y} = \begin{bmatrix} y(0) \\ \ldots \\ y(N-1) \end{bmatrix} \quad (7)$$
$$= \begin{bmatrix} x(0) & x^*(0) & 1 \\ \ldots & \ldots & \ldots \\ x(N-1) & x^*(N-1) & 1 \end{bmatrix} \begin{bmatrix} A_d \\ A_m \\ A_o \end{bmatrix}$$
$$= \begin{bmatrix} \vec{x} & \vec{x}^* & \vec{1} \end{bmatrix} \begin{bmatrix} A_d \\ A_m \\ A_o \end{bmatrix}$$
$$= \vec{X} \begin{bmatrix} A_d \\ A_m \\ A_o \end{bmatrix}$$

$$\vec{y} = \vec{X} \begin{bmatrix} B_d \\ B_m \\ B_o \end{bmatrix} \quad (8)$$

The least square solutions of equations (7) and (8) are (respectively), then:

$$(\vec{X}^+\vec{X})^{-1}\vec{X}^+\vec{y} = (\vec{X}^+\vec{X})^{-1}\vec{X}^+\vec{X}\begin{bmatrix} A_d \\ A_m \\ A_o \end{bmatrix} = \begin{bmatrix} A_d \\ A_m \\ A_o \end{bmatrix} \quad (9)$$

$$(\vec{X}^+\vec{X})^{-1}\vec{X}^+\vec{y} = (\vec{X}^+\vec{X})^{-1}\vec{X}^+\vec{X}\begin{bmatrix} B_d \\ B_m \\ B_o \end{bmatrix} = \begin{bmatrix} B_d \\ B_m \\ B_o \end{bmatrix} \quad (10)$$

Additionally, a relationship between terms of equations (5) and (6) can be established as follows:

$$\frac{A_m}{A_d} = \frac{Ah_m g_d + A^* h_d^* g_m}{Ah_d g_d} \quad (11)$$
$$= \frac{h_m}{h_d} + \frac{A^* h_d^* g_d^* g_m}{Ah_d g_d g_d^*}$$
$$= \frac{h_m}{h_d} + \frac{A_d^* g_m}{A_d g_d^*}$$

$$\frac{B_m}{B_d} = \frac{Bh_m g_d + B^* h_d^* g_m}{Bh_d g_d} \quad (12)$$
$$= \frac{h_m}{h_d} + \frac{B^* h_d^* g_d^* g_m}{Bh_d g_d g_d^*}$$
$$= \frac{h_m}{h_d} + \frac{B_d^* g_m}{B_d g_d^*}$$

-continued $$\frac{A_o}{A_d} = \frac{Ag_d c + A^* g_m c^* + d}{Ah_d g_d} \quad (13)$$
$$= \frac{c}{h_d} + \frac{A^* h_d^* g_d^* g_m c^*}{Ah_d g_d h_d^* g_d^*} + \frac{d}{A_d}$$
$$= \frac{c}{h_d} + \frac{A_d^* c^* g_m}{A_d h_d^* g_d^*} + \frac{d}{A_d}$$

$$\frac{B_o}{B_d} = \frac{Bg_d c + B^* g_m c^* + d}{Bh_d g_d} \quad (14)$$
$$= \frac{c}{h_d} + \frac{B^* h_d^* g_d^* g_m c^*}{Bh_d g_d h_d^* g_d^*} + \frac{d}{B_d}$$
$$= \frac{c}{h_d} + \frac{B_d^* c^* g_m}{B_d h_d^* g_d^*} + \frac{d}{B_d}$$

Equations (11) and (12) and equations (13) and (14) can be combined into the following systems:

$$\begin{bmatrix} \frac{A_m}{A_d} \\ \frac{B_m}{B_d} \end{bmatrix} = \vec{M} \begin{bmatrix} \frac{h_m}{h_d} \\ \frac{g_m}{g_d^*} \end{bmatrix} \Rightarrow (\vec{M}^+\vec{M})^{-1}\vec{M}^+\vec{M}\begin{bmatrix} \frac{h_m}{h_d} \\ \frac{g_m}{g_d^*} \end{bmatrix} \quad (15)$$
$$= (\vec{M}^+\vec{M})^{-1}\vec{M}^+\begin{bmatrix} \frac{A_m}{A_d} \\ \frac{B_m}{B_d} \end{bmatrix}$$
$$= \begin{bmatrix} \frac{h_m}{h_d} \\ \frac{g_m}{g_d^*} \end{bmatrix}$$

$$\begin{bmatrix} \frac{A_o}{A_d} \\ \frac{B_o}{B_d} \\ \frac{A_o^*}{A_d^*} \\ \frac{B_o^*}{B_d^*} \end{bmatrix} = \begin{bmatrix} 1 & \frac{A_d^* g_m}{A_d g_d^*} & \frac{1}{A_d} & 0 \\ 1 & \frac{B_d^* g_m}{B_d g_d^*} & \frac{1}{B_d} & 0 \\ \frac{A_d g_m^*}{A_d^* g_d} & 1 & 0 & \frac{1}{A_d^*} \\ \frac{B_d g_m^*}{B_d^* g_d} & 1 & 0 & \frac{1}{B_d^*} \end{bmatrix} \begin{bmatrix} \frac{c}{h_d} \\ \frac{c^*}{h_d^*} \\ d \\ d^* \end{bmatrix} \quad (16)$$
$$= \vec{N}\begin{bmatrix} \frac{c}{h_d} \\ \frac{c^*}{h_d^*} \\ d \\ d^* \end{bmatrix} \Rightarrow (\vec{N}^+\vec{N})^{-1}\vec{N}^+\vec{N}\begin{bmatrix} \frac{c}{h_d} \\ \frac{c^*}{h_d^*} \\ d \\ d^* \end{bmatrix}$$
$$= (\vec{N}^+\vec{N})^{-1}\vec{N}^+\begin{bmatrix} \frac{A_o}{A_d} \\ \frac{B_o}{B_d} \\ \frac{A_o^*}{A_d^*} \\ \frac{B_o^*}{B_d^*} \end{bmatrix}$$
$$= \begin{bmatrix} \frac{c}{h_d} \\ \frac{c^*}{h_d^*} \\ d \\ d^* \end{bmatrix}$$

Thus, equations (9), (10), (15), and (16) allow one to estimate the parameters (numerical constants) of the transceiver 100 accurately.

As a result of the equations (9), (10), (15), and (16), the structures of compensators 106 and 130 can also be chosen. In particular, values x(n) and v(n) can be chosen as follows:

$$x(n) = u(n) - \frac{h_m}{h_d}u^*(n) - \frac{c}{h_d} \quad (17)$$

$$v(n) = [y(n) - d] - \frac{g_m}{g_d^*}[y^*(n) - d] \quad (18)$$

Now substituting equation (17) into equation (1), $z_t(n)$ for compensator 106 can be reduced as follows:

$$\begin{aligned} z_t(n) &= h_d x(n) + h_m x^*(n) + c \quad (19) \\ &= u(n) - \frac{h_m}{h_d}u^*(n) - \frac{c}{h_d} \\ &= h_d\left(u(n) - \frac{h_m}{h_d}u^*(n) - \frac{c}{h_d}\right) + \\ &\quad h_m\left(u(n) - \frac{h_m}{h_d}u^*(n) - \frac{c}{h_d}\right)^* + c \\ &= h_d u(n) - h_m u^*(n) - c + h_m u^*(n) - \frac{h_m h_m^*}{h_d^*}u(n) - \\ &\quad \frac{h_m c^*}{h_d^*} + c \\ &= h_d u(n) - \frac{h_m h_m^*}{h_d^*}u(n) - \frac{h_m c^*}{h_d^*} \approx h_d u(n) \end{aligned}$$

Since $h_m$ and c are on the order of 30 dB lower in amplitude than $h_d$, the last two terms of equation (19) can be ignored. Thus, compensator 106 effectively compensates for imbalance in the transmit path 102 irrespective of the receive path 104. Now assuming that the phased rotation is introduced by channel A, equation (5) when combined with equations (2) and (19) becomes:

$$\begin{aligned} y(n) &= g_d z_r(n) + g_m z_r^*(n) + d \quad (20) \\ &= A g_d z_t + A^* g_m z_t^*(n) + d \\ &= A g_d h_d u(n) + A^* g_m h_d^* u^*(n) + d \end{aligned}$$

When equation (20) is substituted into equation (18), equation (18) becomes:

$$\begin{aligned} v(n) &= [y(n) - d] - \frac{g_m}{g_d^*}[y^*(n) - d] \quad (21) \\ &= A g_d h_d u(n) + \frac{A g_m^2 h_d^* u(n)}{g_d^*} + \frac{g_m}{g_d^*}(d^* - d) \approx A g_d h_d u(n) \end{aligned}$$

Alternatively, if that the phased rotation is introduced by channel B, equation (5) when combined with equations (3) and (19) becomes:

$$y(n) = B g_d h_d u(n) + B^* g_m h_d^* u^*(n) + d \quad (22)$$

When equation (22) is substituted into equation (18), equation (18) becomes:

$$v(n) \approx B g_d h_d u(n) \quad (23)$$

Thus, from equations (21) and (23), it can be seen that compensator 130 effectively compensates for imbalance in the receive path 104 irrespective of the transmit path 102.

Compensators 106 and 130 can also be extended to compensate for frequency-dependent I/Q distortion. Assuming that $A_m$, $A_d$, $B_m$, and $B_d$ are N-tap digital filters (i.e., finite impulse response filters) instead of constant values, equations (11) and (12) become (in the frequency domain):

$$\frac{A_m(e^{i\omega})}{A_d(e^{i\omega})} = \frac{h_m(e^{i\omega})}{h_d(e^{i\omega})} + \frac{A_d^*(e^{i\omega})g_m(e^{i\omega})}{A_d(e^{i\omega})g_d^*(e^{i\omega})} \quad (24)$$

$$\frac{B_m(e^{i\omega})}{B_d(e^{i\omega})} = \frac{h_m(e^{i\omega})}{h_d(e^{i\omega})} + \frac{B_d^*(e^{i\omega})g_m(e^{i\omega})}{B_d(e^{i\omega})g_d^*(e^{i\omega})} \quad (25)$$

Once the solutions for $$\frac{h_m(e^{i\omega})}{h_d(e^{i\omega})} \text{ and } \frac{g_m(e^{i\omega})}{g_d^*(e^{i\omega})}$$

are obtained, the solutions can be converted back to the time-domain and used in a compensators 106 and 130 in a similar manner to equations (17)-(23). In some applications, model coefficients $h_m$, $h_d$, $g_m$, and $g_d$ can be filters, and at least some multiplications between signals and coefficients in equations (1)-(24) can be replaced with convolutions.

Figure 2A:
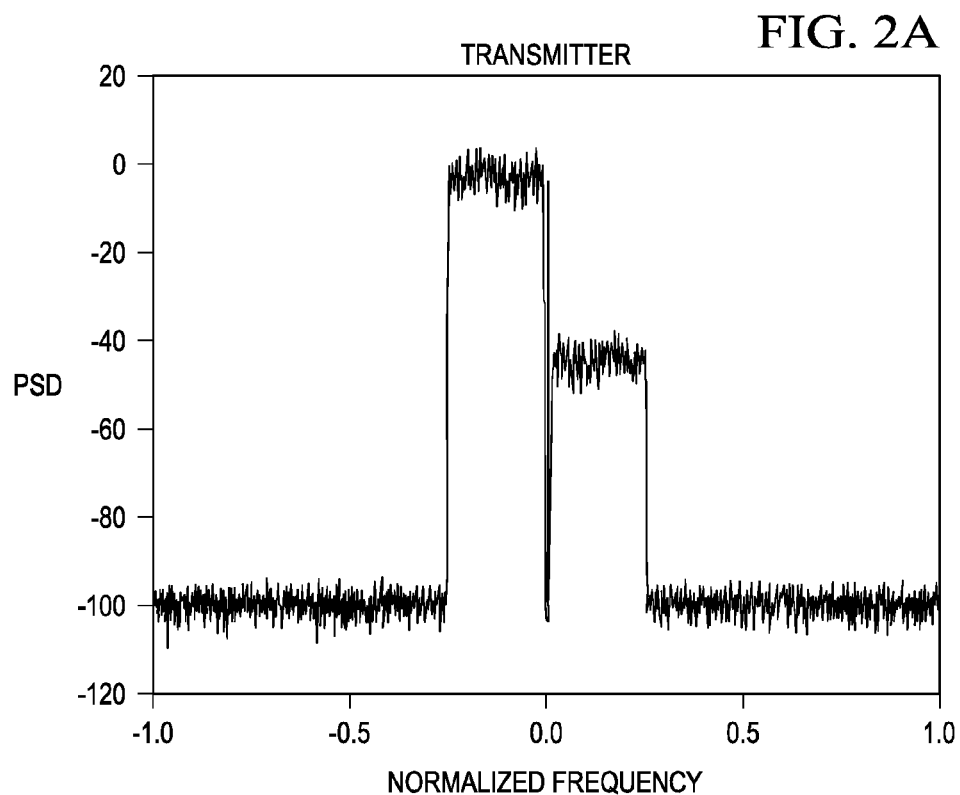
FIGS. 2A and 2B are graphs depicting the operation of the transceiver of FIG. 1 without in-phase/quadrature (I/Q) imbalance compensation.
Figure 2B:
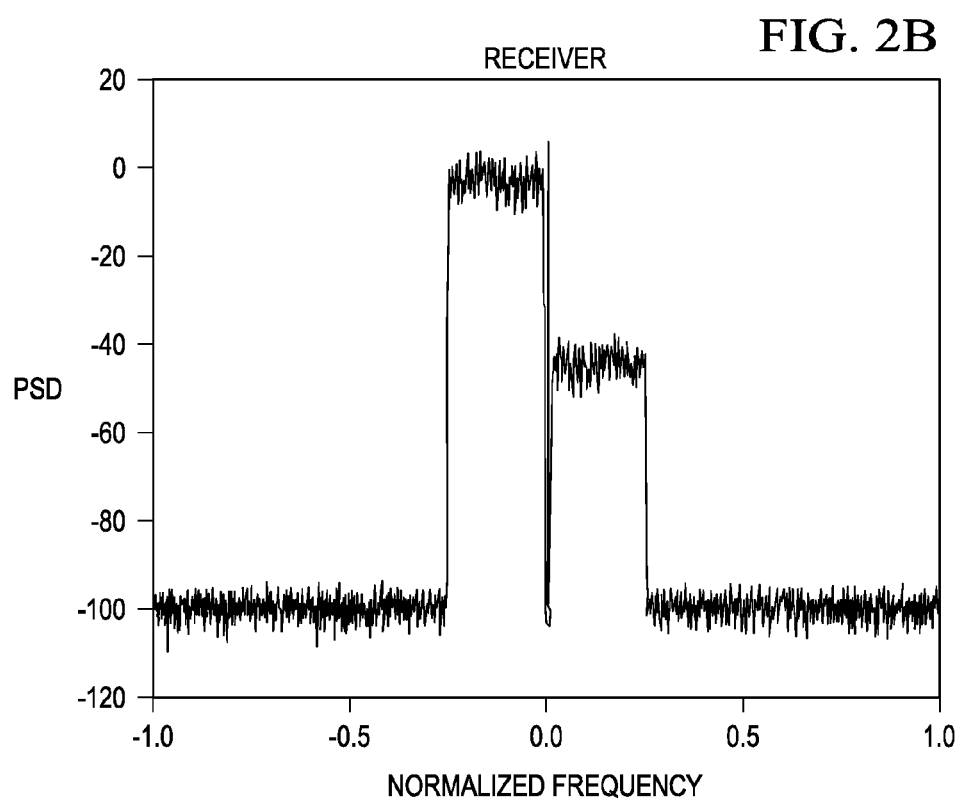
Figure 3A:
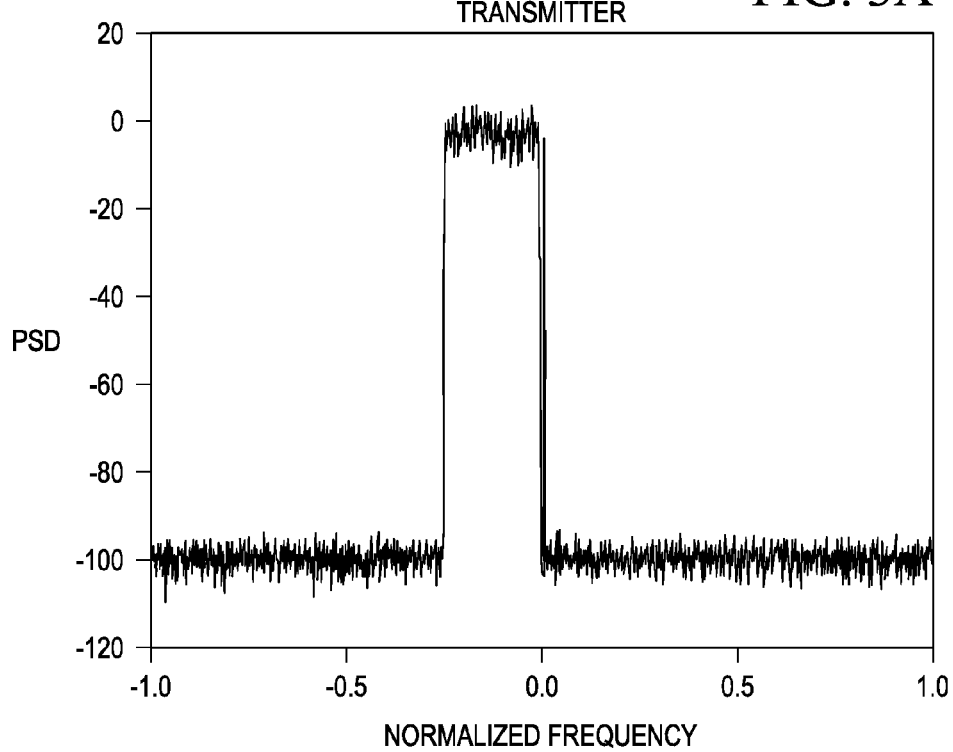
FIGS. 3A and 3B are graphs depicting the operation of the transceiver of FIG. 1 with I/Q imbalance compensation.
Figure 3B:
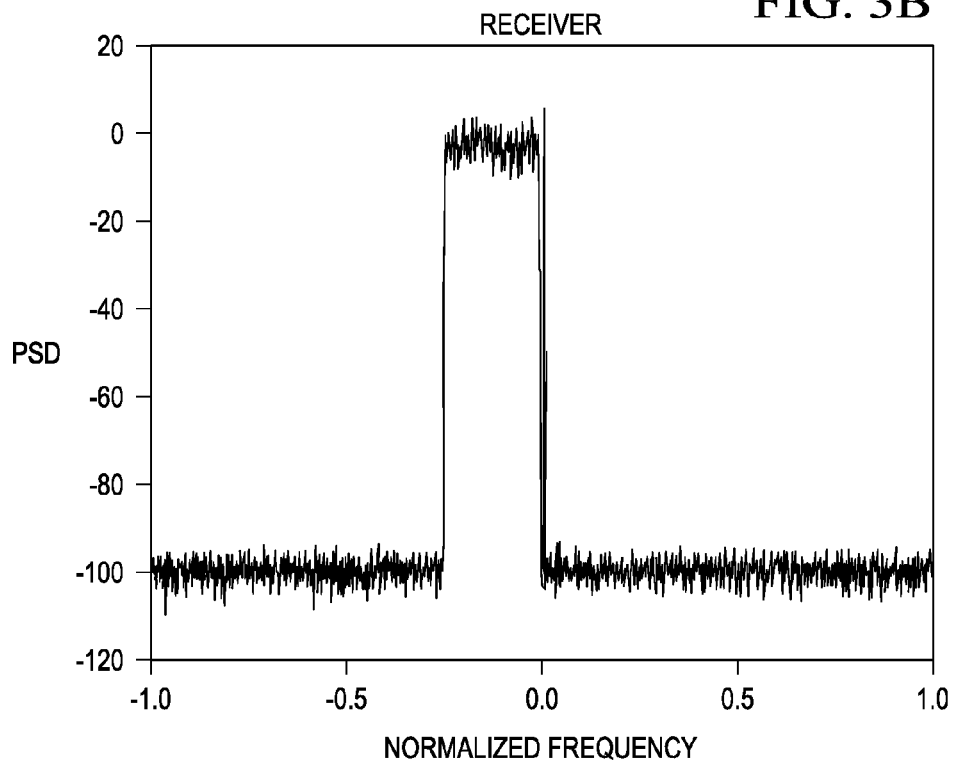

Turning now to FIGS. 2A, 2B, 3A, and 3B, the effects of compensators can be seen. In FIGS. 2A and 2B, the operation of the transmit path 102 and receive path 104 without compensation can be seen. Additionally, in FIGS. 3A and 3B, the operation of the transmit path 102 and receive path 104 can be seen with compensation. As a result of the compensation, it can clearly be seen that the second lower peak for each of the paths 102 and 104 is substantially eliminated, indicating that transceiver 100 is more accurate than conventional transceivers.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a transmit path that is coupled to radio frequency (RF) circuitry, wherein the transmit path includes a modulation compensator that compensates for in-phase/quadrature (I/Q) mismatch in the transmit path;
   a switch that is coupled to the RF circuitry;
   a delay element that is coupled to the RF circuitry and that is coupled to the switch so as to actuate and deactuate the switch; and
   a receive path that is coupled to switch, wherein the receive path includes a demodulation compensator that compensates for I/Q mismatch in the receive path.

2. The apparatus of claim 1, wherein each of the receive and transmit paths further comprise an in-phase path and a quadrature path.

3. The apparatus of claim 2, wherein the in-phase path for the transmit path further comprises:
   an in-phase filter that is coupled to the modulation compensator;

an in-phase digital-to-analog converter (DAC) that is coupled to the in-phase filter;
an in-phase low pass filter (LPF) that is coupled to the in-phase DAC; and
an in-phase mixer coupled to the in-phase LPF.

4. The apparatus of claim 3, wherein the quadrature path for the transmit path further comprises:
a quadrature filter that is coupled to the modulation compensator;
a quadrature DAC that is coupled to the quadrature filter;
a quadrature LPF that is coupled to the quadrature DAC; and
a quadrature mixer coupled to the quadrature LPF.

5. The apparatus of claim 4, wherein the transmit path further comprises:
an adder that is coupled to the in-phase mixer and the quadrature mixer;
a local oscillator that is coupled to the in-phase mixer; and
a phase delay circuit that is coupled to the local oscillator and the quadrature mixer.

6. The apparatus of claim 2, wherein the in-phase path for the receive path further comprises:
an in-phase mixer that is coupled to the switch;
an in-phase LPF that is coupled to the in-phase mixer; and
an in-phase analog-to-digital converter (ADC) that is coupled to the in-phase LPF and the demodulation compensator.

7. The apparatus of claim 6, wherein the quadrature path for the receive path further comprises:
a first quadrature mixer that is coupled to the switch;
a quadrature LPF that is coupled to the first quadrature mixer;
a quadrature ADC that is coupled to the quadrature LPF; and
a second quadrature mixer that is coupled to the quadrature ADC and the demodulation compensator.

8. The apparatus of claim 7, wherein the transmit path further comprises:
a local oscillator that is coupled to the in-phase mixer; and
a phase delay circuit that is coupled to the local oscillator and the first quadrature mixer.

9. The apparatus of claim 1, wherein the relationship between an input signal (u(n)) and an output signal (x(n)) for the modulation compensator is:

$$x(n) = u(n) - \frac{h_m}{h_d} u^*(n) - \frac{c}{h_d},$$

wherein c, $h_m$, and $h_d$ are parameters for the apparatus.

10. The apparatus of claim 1, wherein the relationship between an input signal (y(n)) and an output signal (v(n)) for the demodulation compensator is:

$$v(n) = [y(n) - d] - \frac{g_m}{g_d^*}[y^*(n) - d],$$

wherein d, $g_m$, and $h_d$ are parameters for the apparatus.

11. An apparatus comprising:
a transmit path having:
a modulation compensator that compensates for I/Q mismatch in the transmit path;
an in-phase filter that is coupled to the modulation compensator;
a quadrature filter that is coupled to the modulation compensator;
a first DAC that is coupled to the in-phase filter;
a second DAC that is coupled to the quadrature filter;
a first LPF that is coupled to the first DAC;
a second LPF that is coupled to the second DAC;
a first local oscillator;
a first mixer that is coupled to the first local oscillator and the first LPF;
a first phase delay circuit that is coupled to the first local oscillator;
a second mixer that is coupled to first phase delay circuit and the second LPF; and
an adder that is coupled to the first and second mixers;
RF circuitry that is coupled to the adder;
a switch that is coupled to the RF circuitry;
a delay element that is coupled to the RF circuitry and that is coupled to the switch so as to actuate and deactuate the switch; and
a receive path having:
a third mixer that is coupled to the switch;
a fourth mixer that is coupled to the switch;
a second local oscillator that is coupled to the third mixer;
a second phase delay circuit that is coupled to the second local oscillator and the fourth mixer;
a third LPF that is coupled to the third mixer;
a fourth LPF that is coupled to the fourth mixer;
a first analog-to-digital converter (ADC) that is coupled to the third LPF;
a second ADC that is coupled to the fourth LPF;
a fifth mixer that is coupled to the second ADC; and
a demodulation compensator is coupled to the first ADC and the fifth mixer, wherein the demodulation compensator compensates for I/Q mismatch in the receive path.

12. The apparatus of claim 11, wherein the relationship between an input signal (u(n)) and an output signal (x(n)) for the modulation compensator is:

$$x(n) = u(n) - \frac{h_m}{h_d} u^*(n) - \frac{c}{h_d},$$

wherein c, $h_m$, and $h_d$ are parameters for the apparatus.

13. The apparatus of claim 11, wherein the relationship between an input signal (y(n)) and an output signal (v(n)) for the demodulation compensator is:

$$v(n) = [y(n) - d] - \frac{g_m}{g_d^*}[y^*(n) - d],$$

wherein d, $g_m$, and $h_d$ are parameters for the apparatus.

* * * * *